United States Patent
Ohta

(10) Patent No.: US 7,268,435 B2
(45) Date of Patent: Sep. 11, 2007

(54) CAPACITIVE SEMICONDUCTOR SENSOR

(75) Inventor: Tameharu Ohta, Takahama (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 10/792,734

(22) Filed: Mar. 5, 2004

(65) Prior Publication Data
US 2004/0173913 A1    Sep. 9, 2004

(30) Foreign Application Priority Data
Mar. 7, 2003 (JP) ............................. 2003-061564

(51) Int. Cl.
*H01L 23/48* (2006.01)
*H01L 23/52* (2006.01)
*H01L 29/40* (2006.01)

(52) U.S. Cl. .................. 257/777; 257/778; 257/686; 257/E25.013

(58) Field of Classification Search ................ 257/777, 257/723
See application file for complete search history.

(56) References Cited

U.S. PATENT DOCUMENTS

| | | | |
|---|---|---|---|
| 5,126,813 A | 6/1992 | Takahashi et al. | |
| 5,225,373 A | 7/1993 | Takahashi et al. | |
| 5,412,992 A | 5/1995 | Tobita et al. | |
| 5,721,446 A | 2/1998 | Kobayashi | |
| 5,734,106 A | 3/1998 | Caillat | |
| 5,869,894 A * | 2/1999 | Degani et al. | 257/723 |
| 6,100,593 A * | 8/2000 | Yu et al. | 257/777 |
| 6,150,724 A * | 11/2000 | Wenzel et al. | 257/777 |
| 6,239,484 B1 * | 5/2001 | Dore et al. | 257/687 |
| 6,291,267 B1 * | 9/2001 | Dore et al. | 438/108 |
| 6,316,840 B1 * | 11/2001 | Otani | 257/787 |
| 6,369,435 B1 * | 4/2002 | Igel | 257/415 |
| 6,369,444 B1 | 4/2002 | Degani et al. | |
| 6,410,415 B1 * | 6/2002 | Estes et al. | 438/612 |
| 6,591,689 B2 | 7/2003 | Nidan et al. | |
| 6,815,829 B2 * | 11/2004 | Shibata | 257/777 |
| 6,848,306 B2 | 2/2005 | Kunda | |

FOREIGN PATENT DOCUMENTS

JP   A-UM-S60-129159   8/1985

(Continued)

OTHER PUBLICATIONS

EPO-TEK H20E-PFC Technical Data Sheet, Epoxy Technology, Inc.*

(Continued)

*Primary Examiner*—Sue A. Purvis
*Assistant Examiner*—Benjamin P. Sandvik
(74) *Attorney, Agent, or Firm*—Posz Law Group, PLC

(57) ABSTRACT

In a capacitive semiconductor sensor, a sensor chip and a circuit chip are contained in a package. First bump members are mounted on second electrodes disposed on a second surface of the circuit chip, respectively. The sensor chip is mounted at its first surface on the second surface of the circuit chip so that first electrodes disposed on the first surface of the sensor chip are electrically mechanically connected to the second electrodes through the first bump members, respectively. Second bump members are mounted on third electrodes disposed on the second surface of the circuit chip, respectively. The third electrodes are electrically mechanically connected to lead electrodes disposed to the package through the second bump members, respectively.

8 Claims, 7 Drawing Sheets

FOREIGN PATENT DOCUMENTS

| | | |
|---|---|---|
| JP | A-H01-232735 | 9/1989 |
| JP | A-H02-045721 | 2/1990 |
| JP | A-UM-H02-144770 | 12/1990 |
| JP | A-H03-289528 | 12/1991 |
| JP | A-H05-157648 | 6/1993 |
| JP | 8-110351 | 4/1996 |
| JP | A-H08-086806 | 4/1996 |
| JP | A-H08-193897 | 7/1996 |
| JP | 9-43075 | 2/1997 |
| JP | A-H09-503298 | 3/1997 |
| JP | A-H09-126920 | 5/1997 |
| JP | A-H10-197552 | 7/1998 |
| JP | A-H11-281667 | 10/1999 |
| JP | 11-345932 | 12/1999 |
| JP | 2000-150914 | 5/2000 |
| JP | 2000-227439 | 8/2000 |
| JP | 2001-227902 | 8/2001 |
| JP | A-2002-005951 | 1/2002 |
| JP | A-2002-082009 | 3/2002 |
| JP | 2002-168716 | 6/2002 |
| JP | A-UM-H05-069680 | 9/2006 |

OTHER PUBLICATIONS

Notification of Reasons for Rejection from Japanese Patent Office issued on Jul. 4, 2006 for the corresponding Japanese patent application No. 2002-061564 (a copy and English translation thereof).

Decision of Refusal from Japanese Patent Office issued on Feb. 6, 2007 for the corresponding Japanese patent application No. 2003-061564 (a copy and English translation thereof).

Dismissal of Amendments from Japanese Patent Office issued on Feb. 6, 2007 for the corresponding Japanese patent application No. 2003-061564 (a copy and English translation thereof).

Notification of Reasons for Rejection from Japanese Patent Office issued on Oct. 31, 2006 for the corresponding Japanese patent application No. 2003-061564 (a copy and English translation thereof).

\* cited by examiner

CAPACITIVE SEMICONDUCTOR SENSOR

BACKGROUND OF THE INVENTION

The present invention relates to a capacitive semiconductor sensor, such as an acceleration sensor (accelerometer) or a yaw-rate sensor, adapted to detect dynamic volume as a capacitance change.

As one of such conventional semiconductor capacitive sensors, a well-known accelerometer has such a stack structure that a plurality of semiconductor chips are laminated (stacked) (see FIGS. 10 and 11), which has already been disclosed as Japanese Patent Publication No. 2000-227439.

In this conventional capacitive semiconductor sensor, a sensor chip 1 having an acceleration detecting portion, as shown in FIGS. 12 and 13, is mounted on a circuit chip 2 with a signal processing circuit to be bonded. The circuit chip 2 is also bonded on the inner bottom surface of a package 3 having a concave shape in its vertical cross section so that the sensor chip 1 and the circuit chip 2 are contained in the package 3.

A number of electrode pads 1a, such as four, are formed on one peripheral end portion of the top surface of the semiconductor chip 1. A number of electrode pads 2a, such as four, are formed on one peripheral end portion of the top surface of the circuit chip 2. The positions of the electrode pads 1a correspond to those of the electrode pads 2a.

The electrode pads 1a and the electrode pads 2a are electrically connected by bonding wires 4, respectively. Lead electrodes formed on, for example, both end portions of the top surface of the package 3 are electrically connected to corresponding lead electrodes formed on both end portions of the top surface of the circuit chip 2 by bonding wires 5, respectively.

In this configuration of the capacitive semiconductor sensor, the intervals between the adjacent bonding wires 4 are comparatively narrow, so that parasitic capacitances generating between the adjacent bonding wires 4 may comparatively increase.

In addition, because the bonding wire 4 is easily deformable, external impact may cause the bonding wires 4 to be deformed so that the parasitic capacitances may fluctuate. The fluctuation of the parasitic capacitances may affect the characteristic of the sensor 1, that is, the detection accuracy thereof. In order to prevent this affection, the electrode pads 1a may be formed on each peripheral end portion of the sensor chip's top surface to widen the intervals between the adjacent bonding wires 4. This configuration, however, may need to secure bonding areas on the top surface of the circuit chip 2, which causes the circuit chip's area to be enlarged, and the whole size of the circuit chip 2 to be enlarged.

Packaging of the conventional sensor must be designed while taking into consideration of bonding conditions including the loci of tools for bonding the bonding wires 4 and 5 so that the shape and size of the chips 1 and 2, and the package 3 are limited, respectively, which may cause the sensor's design freedom to decrease.

In the sensor with the above stack structure, as the sensor chip 1, a sensor chip that is as thin as possible is applied to prevent the whole thickness of sensor from being enlarged. This sensor chip, however, may have low rigidity so that it is apt to be distorted. The distortion of the sensor chip may have an effect on the acceleration detecting portion therein, causing errors in the values detected by the acceleration detecting portion.

SUMMARY OF THE INVENTION

The present invention is made on the background.

Accordingly, it is an object of the present invention to provide a capacitive semiconductor sensor, which is capable of being nearly unaffected from parasitic capacitances occurring from an electric connection portion of the semiconductor sensor between its sensor chip and semiconductor chip.

According to one aspect of the present invention, there is provided a capacitive semiconductor sensor comprising; a sensor chip including a dynamic volume detecting portion therein, a first surface, and a plurality of first electrodes, the plurality of first electrodes being disposed on the first surface and electrically connected to the dynamic volume detecting portion, the dynamic volume detecting portion being configured to detect a capacitance change corresponding to a dynamic volume change to output an electric signal change representing the capacitance change through the plurality of first electrodes; a circuit chip including a signal processing circuit therein, a second surface, and a plurality of second and third electrodes disposed on the second surface; a package containing therein the sensor chip and the circuit chip and having a plurality of lead electrodes; a plurality of first bump members mounted on the plurality of second electrodes, respectively, the sensor chip being mounted at its first surface on the second surface of the circuit chip so that the plurality of first electrodes are electrically mechanically connected to the plurality of second electrodes through the plurality of first bump members, respectively; and a plurality of second bump members mounted on the plurality of third electrodes, respectively, the plurality of third electrodes being electrically mechanically connected to the plurality of lead electrodes through the plurality of second bump members, respectively.

According to another aspect of the present invention, there is provided a semiconductor accelerator installed in an object, the semiconductor accelerator comprising: a sensor chip including an acceleration detecting portion therein, a first surface, and a plurality of first electrodes, the plurality of first electrodes being disposed on the first surface and electrically connected to the acceleration detecting portion, the acceleration detecting portion being configured to detect a capacitance change corresponding to an acceleration change of the object to output an electric signal change representing the capacitance change through the plurality of first electrodes; a circuit chip including a signal processing circuit therein, a second surface, and a plurality of second and third electrodes disposed on the second surface; a package containing therein the sensor chip and the circuit chip and having a plurality of lead electrodes; a plurality of first bump members mounted on the plurality of second electrodes, respectively, the sensor chip being mounted at its first surface on the second surface of the circuit chip so that the plurality of first electrodes are electrically mechanically connected to the plurality of second electrodes through the plurality of first bump members, respectively; and a plurality of second bump members mounted on the plurality of third electrodes, respectively, the plurality of third electrodes being electrically mechanically connected to the plurality of lead electrodes through the plurality of second bump members, respectively.

BRIEF DESCRIPTION OF THE DRAWINGS

Other objects and aspects of the invention will become apparent from the following description of an embodiment with reference to the accompanying drawings in which.

DETAILED DESCRIPTION OF EMBODIMENTS OF THE INVENTION

Embodiments of the invention will be described hereinafter with reference to the accompanying drawings.

Incidentally, the embodiments represent capacitive semiconductor sensors each to which the present invention is applied. Each of the capacitive semiconductor sensors is installed in a vehicle and communicable with an airbag installed therein, and is capable of detecting a corresponding vehicle's crash to transmit the crash detection signal to the airbag.

First Embodiment

Figure 1:
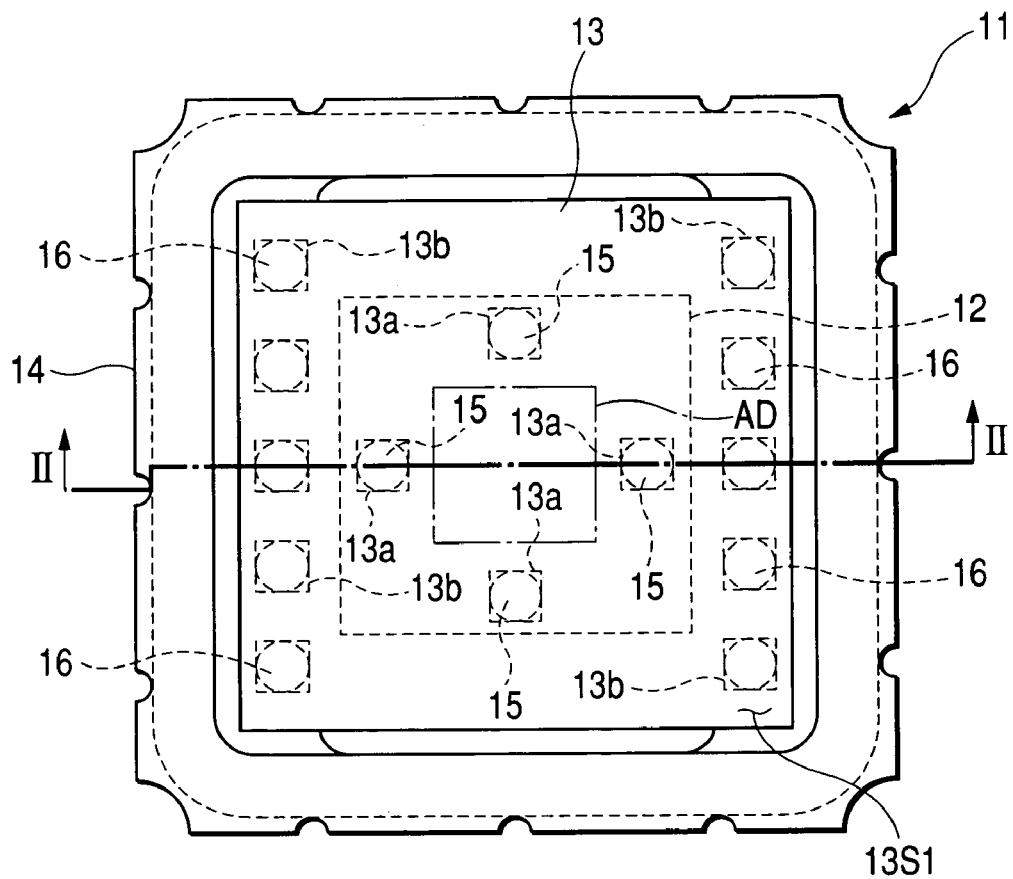
FIG. 1 is a plan view schematically illustrating the whole structure of a semiconductor accelerometer according to a first embodiment of the present invention.
Figure 2:
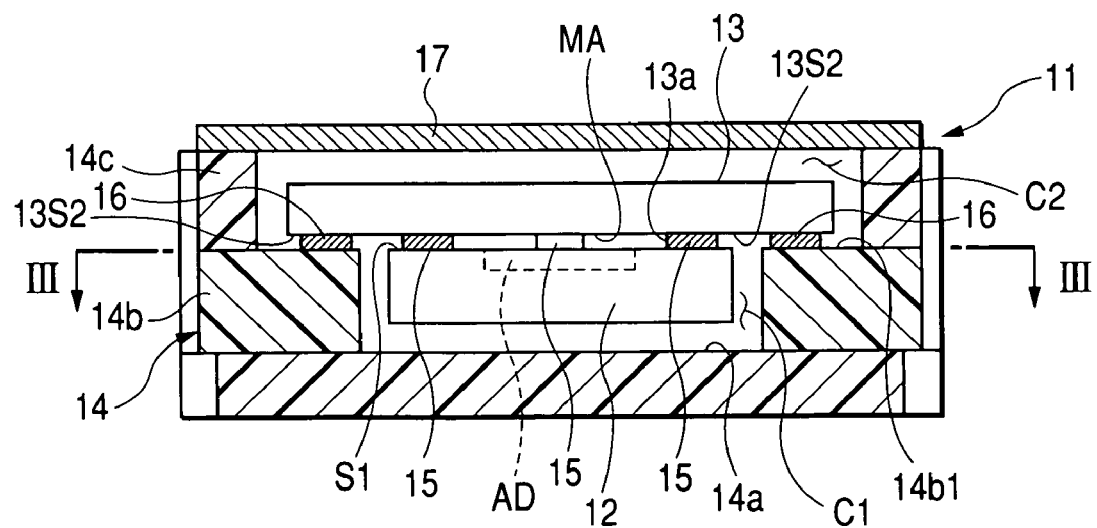
FIG. 2 is a schematically vertical sectional view taken on line II-II in FIG. 1.

FIG. 1 is a plan view schematically illustrating the whole structure of a semiconductor accelerometer 11, whose cap member is removed, according to a first embodiment of the present invention. FIG. 2 is a schematically vertical sectional view taken on line II-II in FIG. 1, and FIG. 3 is a schematically lateral sectional view taken on line III-III in FIG. 2.

Figure 3:
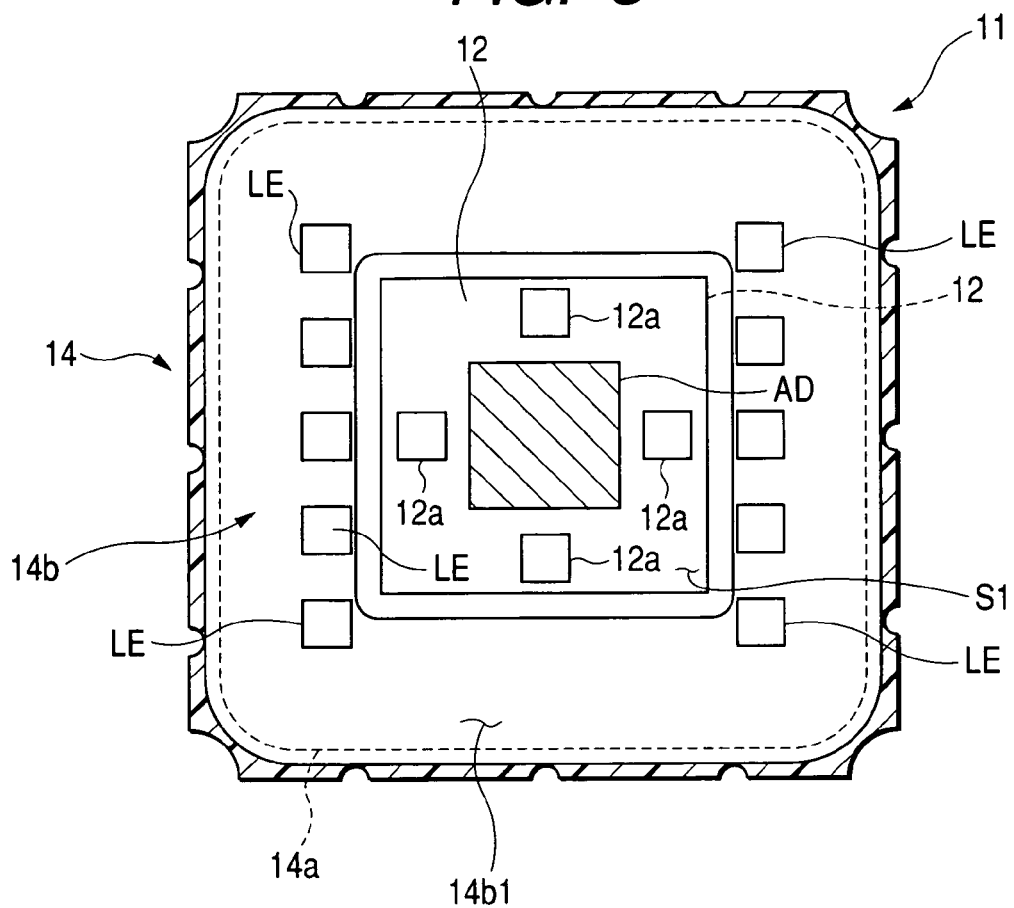
FIG. 3 is a schematically lateral sectional view taken on line III-III in FIG. 2.

In the first embodiment, as shown in FIGS. 1-3, the semiconductor acceleration sensor 11 is provided with a square or rectangular parallelepiped sensor chip 12 and a substantially square or rectangular parallelepiped circuit chip 13 on which the sensor chip 12 is mounted to provide a stack structure.

The semiconductor accelerometer 11 is also provided with a substantially square or rectangular parallelepiped package 14 in which the stuck-structured sensor and circuit chips 12 and 13 are contained.

The sensor chip 12 is composed of a silicon substrate. The center of the top surface portion of the sensor chip 12 is formed with an acceleration detecting portion AD, as dynamic volume detecting portion. The acceleration detecting portion AD is configured to detect acceleration in at least one predetermined direction.

The acceleration detecting portion AD, whose structure is well-known, is provided with a beam assembly having a substantially bar-shaped mass portion and a pair of beam members. The mass portion is located in an opening portion formed in the top surface portion of the silicon substrate and movably supported at both ends by the paired beam members in the at least one predetermined direction, respectively.

The acceleration detecting portion AD is also provided with a fixed electrode assembly having a plurality of fixed electrodes. The fixed electrodes are fixedly formed in a silicon layer of the peripheral portion of the silicon chip's top surface S1 by MEMS (Micro-Electro-Mechanical Systems). The acceleration detecting portion AS is also provided with a plurality of movable electrodes extending parallel from the mass portion orthogonally to the longitudinal direction (the at least one predetermined direction) of the mass portion.

The movable electrodes are arranged to be opposite to the fixed electrodes at predetermined thin gaps.

That is, when the acceleration of an object, such as a vehicle, on which the semiconductor accelerometer 11 is installed, changes, capacitance changes between each fixed electrode and each movable electrode of the acceleration detecting portion AD occur due to the acceleration change, so that the acceleration detecting portion AD can detect the electrical signal change corresponding to the capacitance changes as the capacitance changes. The electric signals are taken from electrode pads connected to the fixed electrodes and the movable electrodes.

The semiconductor accelerometer 11 is provided with a number of, for example, four electrode pads 12a formed on the top surface S1 of the sensor chip 12. The electrode pads 12a are connected to the electrode pads of the acceleration detecting portion AD so that the electrode pads 12a are served as electrical connection between the sensor chip 12 and the circuit chip 13.

In this first embodiment, as shown in FIG. 1, the electrode pads 12a are located on the peripheral portions of the chip's top surface S1, respectively. Each electrode pad 12a is positioned in the middle of each periphery (side) of the chip's top surface S1 so that the electrode pads 12a are arranged at approximately regular intervals over the whole periphery of the chip's top surface S1. That is, the electrode pads 12a are so positioned as to be adjacent to the sides of the acceleration detecting portion AD and to face thereto, respectively.

The circuit chip 13 has top and bottom surfaces 13s1 and 13s2 opposite to each other, and whose areas are larger than the top surface's area of the semiconductor chip 12. The circuit chip 13 contains a signal processing circuit operative to operate the electrical signal detected by the sensor chip 12.

The center area of the bottom surface 13s2 of the circuit chip 13 is defined as the chip mount area MA on which the sensor chip 12 is mounted.

The semiconductor accelerometer 11 is provided with a number of, for example, four electrode pads 13a formed on the chip mount area MA of the circuit chip's bottom surface 13s2 so as to correspond to the electrode pads 12a, respectively.

The semiconductor accelerometer 11 is also provided with a number of, for example ten electrode pads 13b. That is, five of the electrode pads 13b are so formed on one of the paired opposing sides of the bottom surface 13s2 of the circuit chip 13 as to be arranged in a row at regular intervals. The remaining five electrode pads 13b are so formed on other of the paired opposing sides of the bottom surface 13s2 as to be arranged in a row at regular intervals, The package 14 is made of, for example, ceramic substrate, and designed to have a substantially inner-hollowed and top-opened rectangular-parallelepiped shape with a thin thickness.

That is, the package 14 is composed of a square or rectangular bottom wall 14a, and a square or rectangular tubular wall 14b mounted at its bottom surface on the periphery of the top surface of the bottom wall 14a. The bottom wall 14a and the tubular wall 14b provide a sensor chip containing chamber C1 therebetween in which the sensor chip 12 is contained.

The package 14 is also composed of a square or rectangular tubular wall 14c mounted at its bottom surface on the outer periphery of the top surface 14b1 of the tubular wall 14b. The tubular wall 14c and the inner periphery of the top surface 14b1 of the tubular wall 14b provide a circuit chip containing chamber C3 in which the circuit chip 13 is contained.

The semiconductor accelerator 1 is provided at the inner periphery of the top surface 14b1 of the tubular wall 14b with a number of, for example ten lead electrodes LE formed on the inner periphery of the tubular wall's top surface 14b1 so as to correspond to the electrode pads 13b, respectively.

These lead electrodes LE are electrically connected to exterior leads (not shown) formed at the external surface portion of the package 14, respectively.

The semiconductor accelerometer 11 is composed of a plurality of, that is, four electrically conductive adhesive bumps 15. The four bumps 15 are interposed between the electrode pads 12a of the sensor chip 12 and the electrode pads 13a of the circuit chip 13, respectively, That is, the sensor chip 12 is mounted face-down on the circuit chip 13 so that the electrode pads 12a and the electrode pads 13a are electrically mechanically connected to each other by the bumps 15. As a result, the sensor chip 12 is electrically mechanically mounted on the circuit chip 13 by adhesive conductive bump connection based on the flip-chip method, which is designed as a multi-chip module.

In addition, the semiconductor accelerator 11 is composed of a plurality of, that is, ten electrically conductive adhesive bumps 16. The ten bumps 16 are interposed between the electrode pads 13b of the circuit chip 13 and the lead electrodes LE of the package 14, respectively, That is, the multi-chip module circuit chip 13 is mounted face-down on the top surface 14b1 of the package's tubular wall 14b so that the electrode pads 13b and the lead electrodes LE are electrically mechanically connected to each other by the adhesive conductive bumps 16. Incidentally, as the electrically conductive adhesive bumps 15 and 16, solder bumps, gold bumps, or other similar material bumps may be used.

Furthermore, the semiconductor accelerator 11 is composed of a cap member 17 fitted in the top opened wall of the package 14 so that the top opened wall of the package 14 is air-tightly closed.

The bumps 15 and 16 can be previously formed simultaneously on the electrode pads 13a and 13b, respectively, by plating method or by flip-chip bonding as stud bumps.

In cases of using these method, the bumps 15 and 16 may be formed on a wafer on which the plurality of groups each having components of the circuit chip 13 are formed. That is, after the bumps 15 and 16 are formed, the component groups are cut to make each circuit chip 13. In addition, it is reasonable that, in cases of using these methods, the bumps 15 and 16 may be formed on the each circuit chip 13 after cutting.

The sensor chip 12 may be mounted on the circuit chip 13 by ultrasonic pressure bonding, thermal pressure boding, or reflow bonding.

When mounting the multi-chip module circuit chip 13 on the top surface 14b1 of the package's tubular wall 14b, one of the same bonding methods described above may be applied.

As described above, in the structure of the semiconductor accelerator 11, the sensor chip 12 and the circuit chip 13 are electrically and mechanically connected to each other by the bumps 15, which eliminates the need for securing bonding areas required for the connections of the sensor chip and the circuit chip by bonding wires.

The structure of the semiconductor accelerator 11, therefore, allows the intervals between adjacent bumps to be wide without causing inconveniences such as the area of the circuit chip 13 being large, which makes it possible to reduce the parasitic capacitances caused among the bumps 15.

In addition, the bump 15 has more rigidity as compared with bonding wires, which can prevent the bump 15 itself from being deformed irrespective of exterior shocks, making it possible to prevent the parasitic capacitances from varying.

In particular, in the first embodiment, because each electrode pad 12a is positioned in the middle of each side of the chip's top surface S1, each bump 15 is similarly positioned in the middle of each side of the chip's top surface S1. This structure, in addition to the above effects of making wide the intervals of the adjacent bumps 15 to reduce the parasitic capacitances caused among the bumps 15, keeps the mechanical connectability between the sensor chip 12 and the circuit chip 13 balanced well.

The bump connection between the sensor chip 12 and the circuit chip 13 enables the batch connections between all of the electrode pads 12a and all of the corresponding electrode pads 13a.

In addition, the circuit chip 13 and the package 14 are electrically mechanically connected to each other by bumps 16, which allows the batch connections between all of the electrode pads 13a and all of the corresponding lead electrodes LE.

These batch connections improve the packaging ability of the semiconductor accelerator 1.

In addition, the structure of the semiconductor accelerator 1 has no need to take into consideration of the loci of tools for bonding wires, making it possible to improve the freedom of the chip's design.

As described above, in the semiconductor accelerator 1 having such a stuck structure that the sensor chip 12 is mounted on the circuit chip 13, the sensor chip 12 and the circuit chip 13, and the circuit chip 13 and the package 14 are mechanically and electrically connected to each other by bumps 15 and 16. These bump connections reduce the parasitic capacitances caused among the electrical connection portions between the sensor chip 12 and the circuit chip 13, thereby improving the sensing ability and design freedom of the accelerator 1, respectively.

Second to Seventh Embodiments

Next, second to seventh embodiments of the present invention will be explained hereinafter.

Incidentally, elements of each semiconductor accelerator according to each of the second to seventh embodiments, which are substantially identical with those of the semiconductor accelerator 11 according to the first embodiment, are assigned to the same reference characteristics of the semiconductor accelerator shown in FIGS. 1-3, and explanations thereabout are omitted or simplified. That is, specific points of each semiconductor accelerator according to each of the second to seventh embodiments different from the semiconductor accelerator 11 according to the first embodiment are focused.

Second Embodiment

Figure 4:
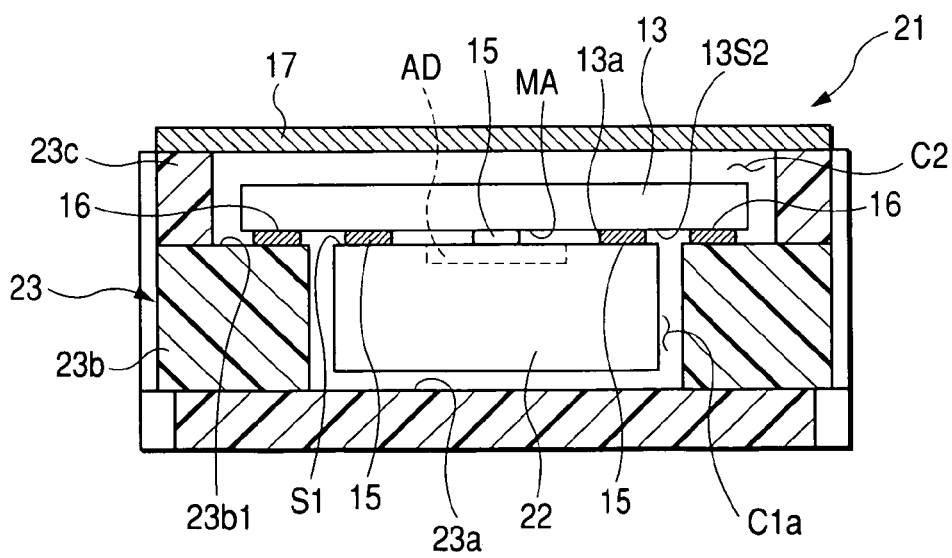
FIG. 4 is a schematically vertical sectional view of a semiconductor accelerator according to a second embodiment of the present invention.

FIG. 4 is a schematically vertical sectional view of a semiconductor accelerator 21 according to a second embodiment of the present invention, which corresponds to FIG. 2 of the first embodiment.

The semiconductor accelerator 21 is provided with a package 23 corresponding to the package 14, That is, the package 23 is composed of a square or rectangular bottom wall 23a, a square or rectangular tubular wall 23b mounted on the periphery of the top surface of the bottom wall 14a, and a square or rectangular tubular wall 23c mounted on the outer periphery of the top surface 23b1 of the tubular wall 23b.

In this second embodiment, a sensor chip 22 has a sufficient thickness that is capable of resisting thermal stress caused from the package 23

The tubular wall 23b also has a sufficient thickness that allows the sensor chip containing chamber C1a provided between the tubular wall 23b and the bottom wall 23a to contain the sensor chip 22.

Similarly, the sensor chip 22 and the circuit chip 13, and the circuit chip 13 and the package 23 are mechanically and electrically connected to each other by bumps 15 and 16.

Note that, in a semiconductor accelerator installed in vehicles, the semiconductor accelerator is used in an environment that depends on the heat cycle of the vehicle, In addition, the thermal expansion coefficient of package 23 is different from those of the sensor chip 22 and the circuit chip 13. This characteristic may cause the thermal stress from the package 23 to be transferred to the sensor chip 22 so that the sensor chip 22 is apt to be distorted. The distortion of the sensor chip 22 may cause errors in the values detected by the acceleration detecting portion AD.

In the second embodiment, however, based on the high design freedom of the sensor chip 22 obtained by the use of the bumps 15 and 16, the sensor chip 22 and the package 23 are designed that the sensor chip 22 has the sufficient thickness to be resistant to the thermal stress caused from the package 23, making it possible to prevent the sensor chip 22 from being distorted due to the thermal stress from the package 23.

Third Embodiment

Figure 5:
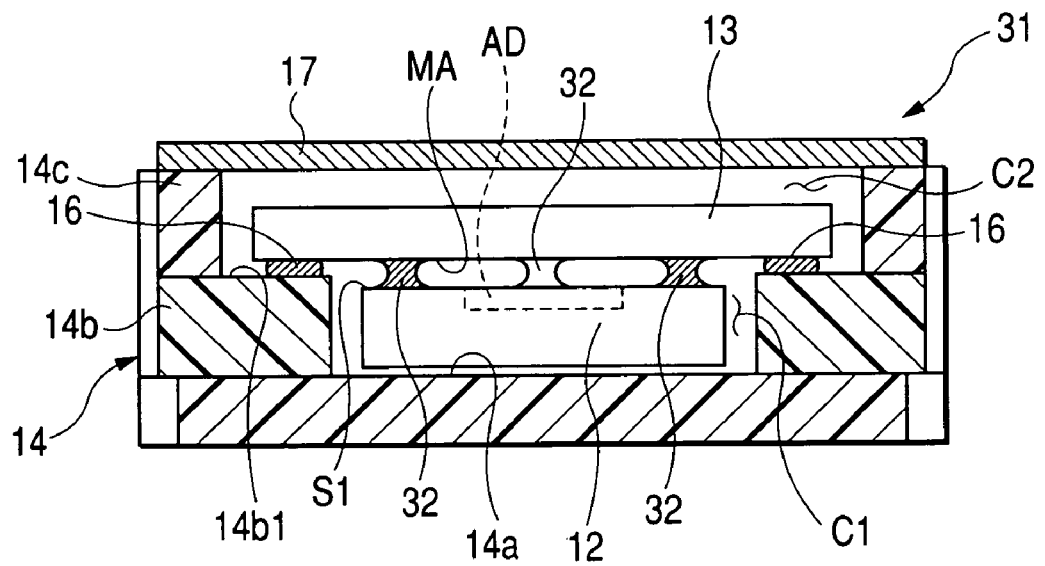
FIG. 5 is a schematically vertical sectional view of a semiconductor accelerator according to a third embodiment of the present invention.

FIG. 5 is a schematically vertical sectional view of a semiconductor accelerator 31 according to a third embodiment of the present invention, which corresponds to FIG. 2 of the first embodiment.

In the third embodiment, each thickness (height, length) of each of bumps 32 connecting between each of the electrode pads 12a and each of the electrode pads 13, is larger than that of each of the bumps 16, which connect the electrode pads 13a of the circuit chip 13 and the lead electrodes LE of the package 14.

In this structure, when the thermal stress caused from the package 14 is applied on the circuit chip 13, because the circuit chip 13 and the sensor chip 12 are mechanically connected by the bumps 32 each having the large height, the thermal stress transferred through the circuit chip 12 are absorbed in the bumps 32, making it possible to prevent the sensor chip 12 from being distorted due to the thermal stress from the package 14.

Fourth Embodiment

Figure 6:
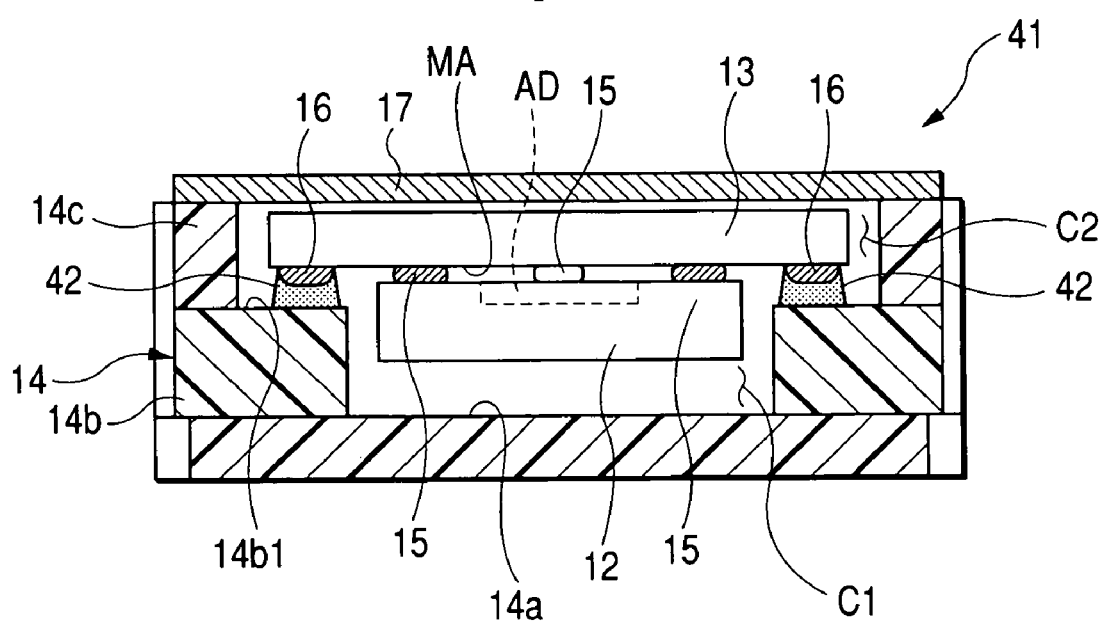
FIG. 6 is a schematically vertical sectional view of a semiconductor accelerator according to a fourth embodiment of the present invention.

FIG. 6 is a schematically vertical sectional view of a semiconductor accelerator 41 according to a fourth embodiment of the present invention, which corresponds to FIG. 2 of the first embodiment.

In the fourth embodiment, the semiconductor acceleration 41 is composed of a plurality of, that is, ten electrically conductive adhesive members 42 interposed between the bumps 16 mounted on the electrode pads 13b of the circuit chip 13 and the lead electrodes LE of the package 14, respectively.

This structure allows the elasticity of the electrically conductive adhesive members 42 to absorb the thermal stress caused from the package 14 to the circuit ship 13, making it possible to prevent the sensor chip 12 from being distorted due to the thermal stress from the package 14.

Fifth Embodiment

Figure 7:
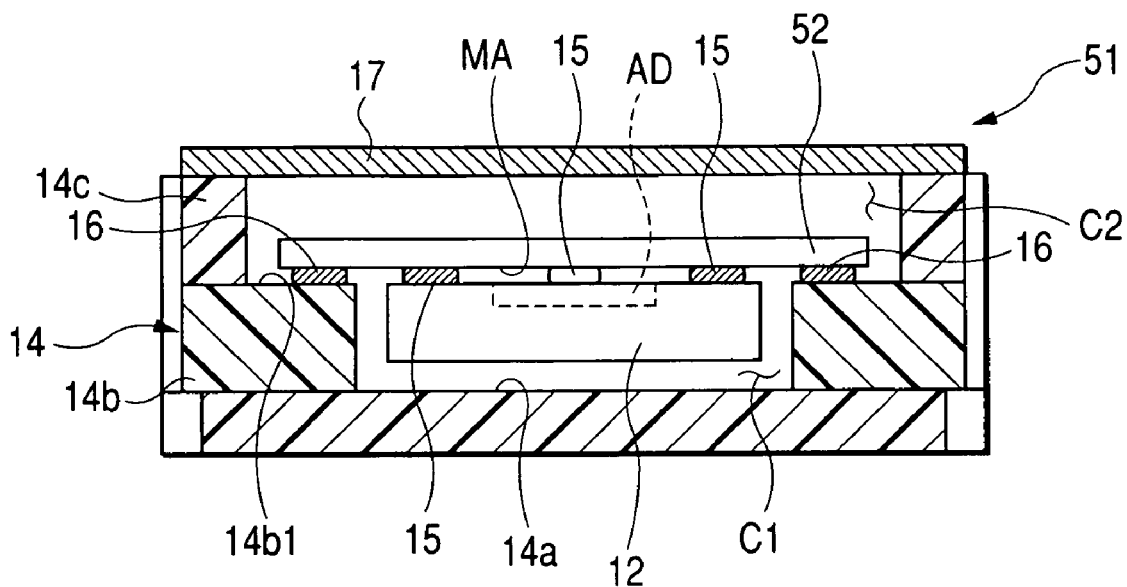
FIG. 7 is a schematically vertical sectional view of a semiconductor accelerator according to a fifth embodiment of the present invention.

FIG. 7 is a schematically vertical sectional view of a semiconductor accelerator 51 according to a fifth embodiment of the present invention, which corresponds to FIG. 2 of the first embodiment.

In this fifth embodiment, a circuit chip 52 has a sufficiently thin thickness that is absorptive to the thermal stress caused from the package 23.

That is, when the thermal stress caused from the package 14 is applied to the circuit chip 52, because the circuit chip 52 has the sufficiently thin thickness, the circuit chip 52 is bent to absorb the thermal stress, making it possible to prevent the sensor chip 12 from being distorted due to the thermal stress from the package 14.

Sixth Embodiment

Figure 8:
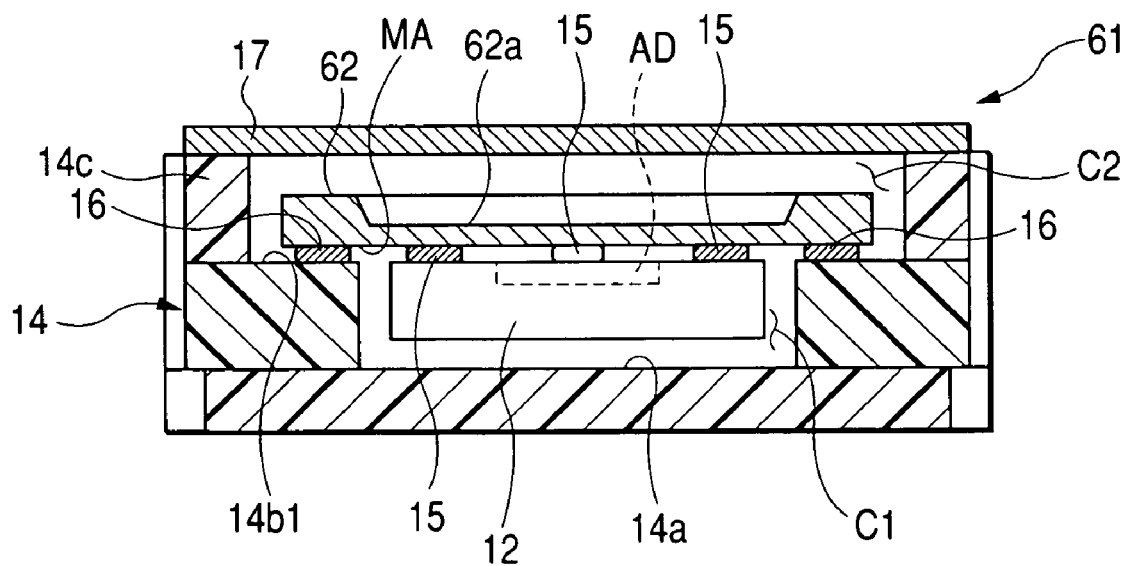
FIG. 8 is a schematically vertical sectional view of a semiconductor accelerator according to a sixth embodiment of the present invention.

FIG. 8 is a schematically vertical sectional view of a semiconductor accelerator 61 according to a sixth embodiment of the present invention, which corresponds to FIG. 2 of the first embodiment.

In this sixth embodiment, a circuit chip 62 is formed at its center portion with a diaphragm portion 62a. That is, the center portion of the circuit chip 62 is inwardly concaved to form the diaphragm portion 62a.

The diaphragm portion 62a has a sufficiently thin thickness absorptive to the thermal stress caused from the package 23

That is, when the thermal stress caused from the package 14 is applied to the circuit chip 62, because the diaphragm portion 62a has the sufficiently thin thickness, the diaphragm portion 62a of the circuit chip 62 is bent to absorb the thermal stress, making it possible to prevent the sensor chip 12 from being distorted due to the thermal stress from the package 14.

Seventh Embodiment

Figure 9:
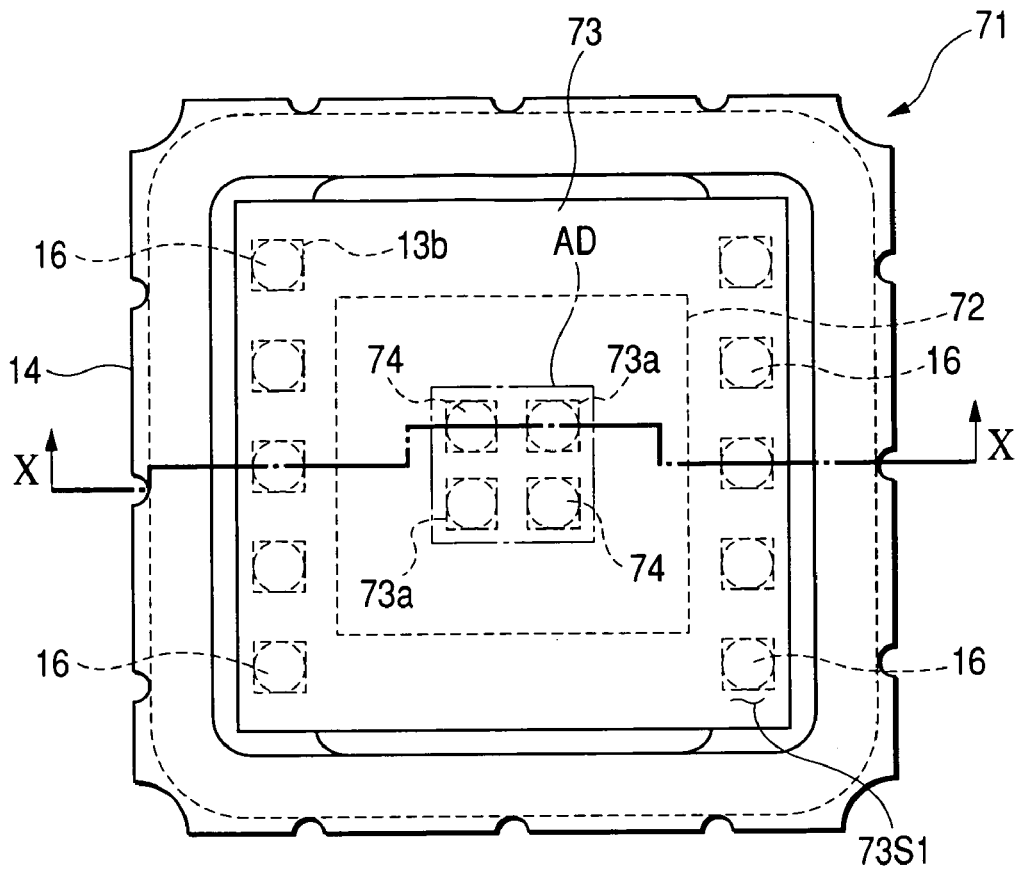
FIG. 9 is a plan view schematically illustrating the whole structure of a semiconductor accelerometer, whose cap member is removed, according to a seventh embodiment of the present invention.
Figure 10:
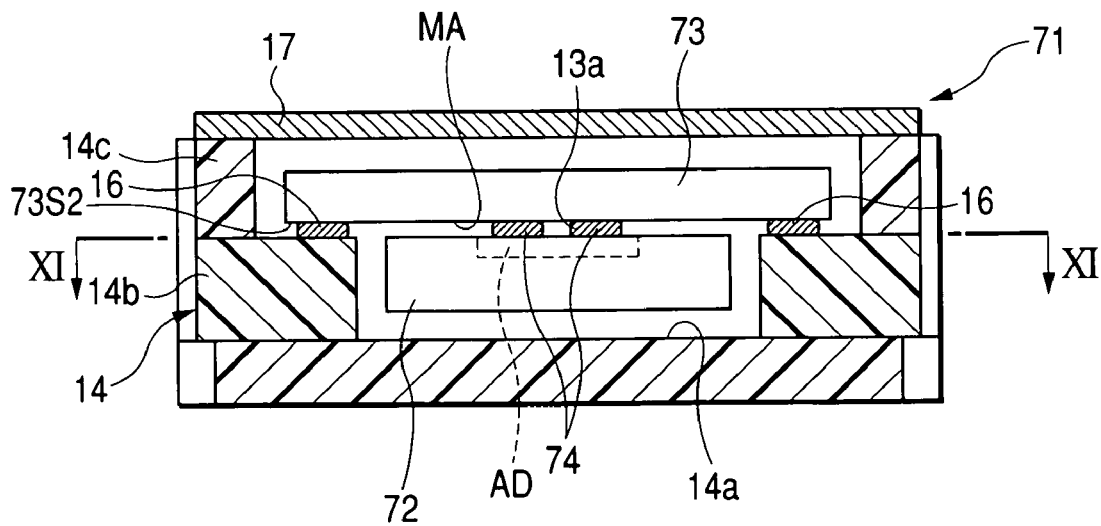
FIG. 10 is a schematically vertical sectional view taken on line X-X in FIG. 9.
Figure 11:
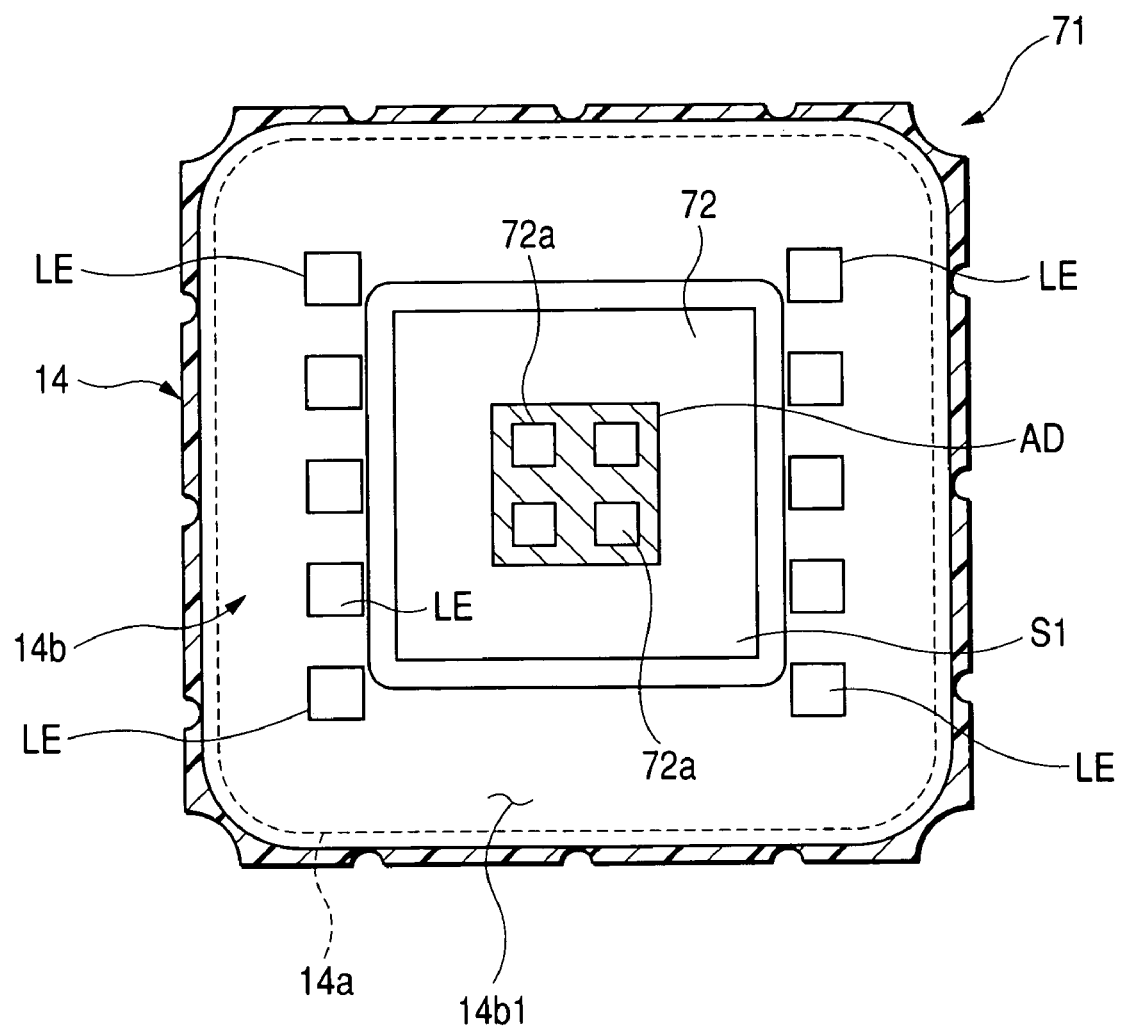
FIG. 11 is a schematically lateral sectional view taken on line XI-XI in FIG. 10.
Figure 12:
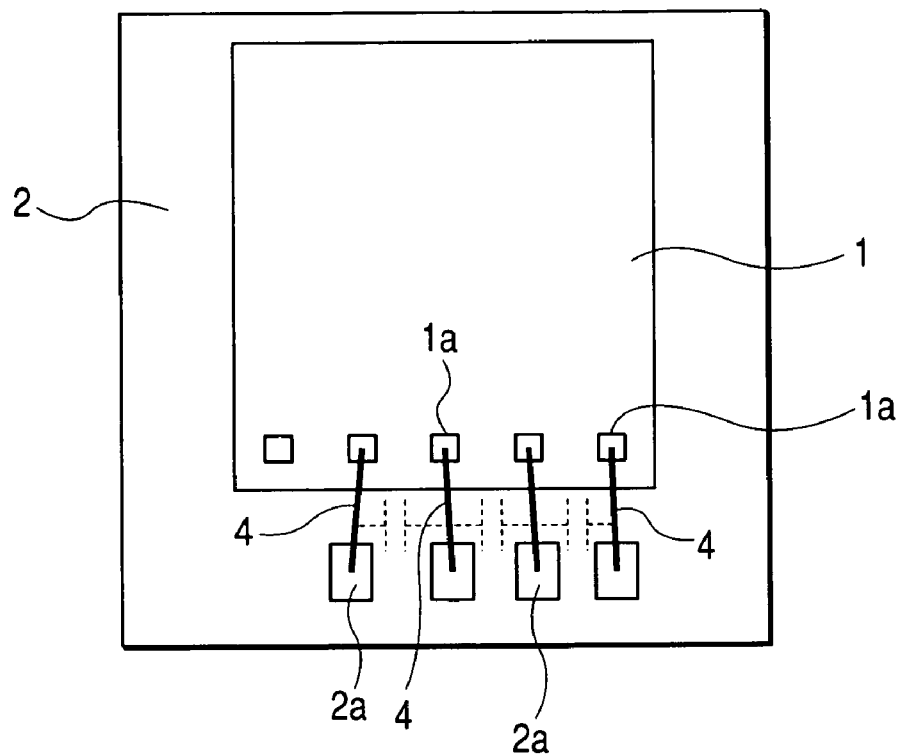
FIG. 12 s a plan view schematically illustrating the whole structure of a conventional semiconductor accelerometer, whose cap member is removed.
Figure 13:
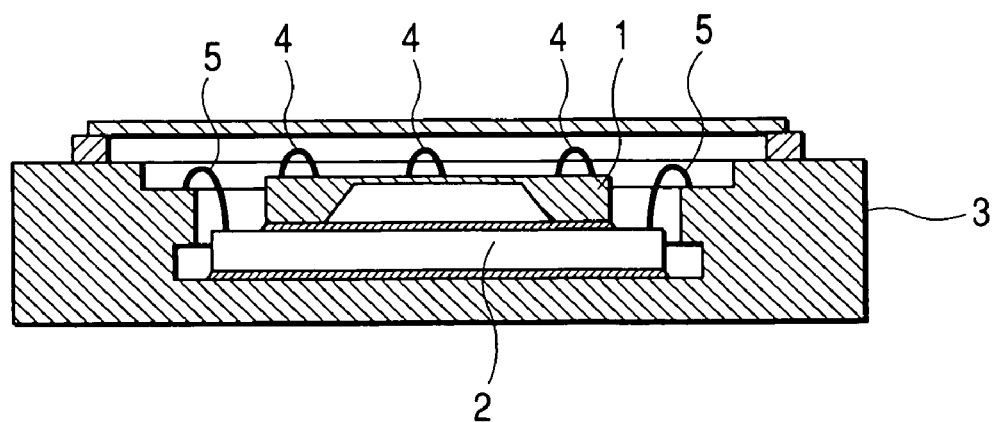
FIG. 13 is a schematically vertical sectional view of the conventional semiconductor accelerometer shown in FIG. 12.

FIG. 9 is a plan view schematically illustrating the whole structure of a semiconductor accelerometer 71, whose cap member is removed, according to a seventh embodiment of the present invention. FIG. 10 is a schematically vertical sectional view taken on line X-X in FIG. 9, and FIG. 11 is a schematically lateral sectional view taken on line XI-XI in FIG. 10.

In the seventh embodiment, the semiconductor accelerometer 71 is provided with a square or rectangular parallelepiped sensor chip 72 and a substantially square or rectangular parallelepiped circuit chip 73 on which the sensor chip 72 is mounted to provide a stack structure as well as the sensor chip 12 and the circuit chip 13.

The semiconductor accelerometer 71 is also provided with a number of, for example, four electrode pads 72a formed on the acceleration detecting portion AD of the sensor chip arranged in, for example, a matrix. That is, the electrode pads 12a are served as lead electrodes of the acceleration detecting portion AD and as electrical connection between the sensor chip 72 and the circuit chip 73. The circuit chip 73 has top and bottom surfaces 73s1 and 73s2 opposite to each other.

The semiconductor accelerometer 71 is provided with a number of, for example, four electrode pads 73a formed on the chip mount area MA of the circuit chip's bottom surface 73s2 so as to correspond to the electrode pads 72a, respectively.

The semiconductor accelerator 71 is composed of a plurality of, that is, four electrically conductive adhesive bumps 74. The four bumps 74 are interposed between the electrode pads 72a of the sensor chip 72 and the electrode pads 73a of the circuit chip 73, respectively, That is, the sensor chip 72 is mounted face-down on the circuit chip 73 so that the electrode pads 72a and the electrode pads 73a are electrically mechanically connected to each other by the bumps 74.

In this structure, the bumps 74 are kept from the package portion 14 (the tubular wall 14b), which allows the thermal stress from the package 14 to be hardly transferred through the bumps 74 to the sensor chip 72, making it possible to prevent the sensor chip 72 from being distorted due to the thermal stress from the package 14.

Incidentally, in each of the first to seventh embodiments, the present invention is applied to each of the semiconductor accelerators corresponding to the first to seventh embodiments, but the present invention may be applied to other types of capacitive semiconductor sensors, such as a yaw-rate sensor.

In addition, in each of the first to seventh embodiments, each of the semiconductor accelerators is provided with single sensor chip mounted on the circuit chip. The present invention, however, is not limited to this structure. That is, a capacitive sensor according to the present invention may have a plurality of sensor chips mounted on the circuit chip.

In addition, it is possible to combine one of the structures related to the first to seventh embodiments with another one of the structures related to the first to seventh embodiment.

Moreover, the shapes of the sensor chip, the circuit chip, and the package may be changed within the scope of the present invention. Furthermore, the number of the electrode pads of the sensor chip, that of the electrode pads of the circuit chips, and that of the bumps connecting the sensor chip's pads and the circuit chip's pads may be changed within the scope of the present invention. Similarly, the number of the electrode pads of the circuit chips, and that of the lead electrodes may be changed within the scope of the present invention.

In addition, the positions of the sensor chip's electrode pads, those 19, of the circuit chip's electrode pads, and those of the bumps connecting the sensor chip's pads and the circuit chip's pads may be changed within the scope of the present invention. Similarly, the positions of the circuit chip's electrode pads, and those of the lead electrodes may be changed within the scope of the present invention.

While there has been described what is at present considered to be the embodiments and modifications of the invention, it will be understood that various modifications which are not described yet may be made therein, and it is intended to cover in the appended claims all such modifications as fall within the true spirit and scope of the invention.

This application is based upon and claims the benefit of priority of the prior Japanese Patent Application 2003-061564 filed on Mar. 7, 2003 so that the contents of which are incorporated herein by reference.

What is claimed is:

1. A capacitive semiconductor sensor, comprising:
a sensor chip including a dynamic volume detecting portion therein, a first surface, and a plurality of first electrodes, said plurality of first electrodes being disposed on the first surface and electrically connected to the dynamic volume detecting portion, said dynamic volume detecting portion being configured to detect a capacitance change corresponding to a dynamic volume change to output an electric signal change representing the capacitance change through the plurality of first electrodes;
a circuit chip including a signal processing circuit therein, a second surface, and a plurality of second and third electrodes disposed on the second surface;
a package containing therein the sensor chip and the circuit chip and having a plurality of lead electrodes;
a plurality of first bump members mounted on the plurality of second electrodes, respectively, said sensor chip being mounted at its first surface on the second surface of the circuit chip so that the plurality of first electrodes are electrically mechanically connected to the plurality of second electrodes through the plurality of first bump members, respectively; and
a plurality of second bump members mounted on the plurality of third electrodes, respectively, said plurality of third electrodes being electrically mechanically connected to the plurality of lead electrodes through the plurality of second bump members, respectively,
wherein each of said plurality of first bump members has a first predetermined length between a corresponding one of the plurality of first electrodes and a corresponding one of the plurality of second electrodes, each of said plurality of second bump members has a second predetermined length between a corresponding one of the plurality of third electrodes and a corresponding one of the plurality of lead electrodes, said first predetermined length of each of the plurality of first bump members is different from said second predetermined length of a corresponding one of the plurality of second bump members, and each of said plurality of second bump members comprises:

a bump mounted on each of the plurality of third electrodes; and an electrical conductive adhesive member with elasticity interposed between the bump and each of the plurality of lead electrodes, and wherein:

the sensor chip has a first thermal expansion coefficient, the circuit chip has a second thermal expansion coefficient, the package has a third thermal expansion coefficient, the third thermal expansion coefficient being different from the first thermal expansion coefficient and the second thermal expansion coefficient, the difference between the package and each of the sensor chip and the circuit chip in thermal expansion coefficient causing thermal stress from the package to be transferred to the sensor chip, and the elasticity of the electrical conductive adhesive interposed between the bump mounted on each of the plurality of third electrodes and a corresponding one of the plurality of lead electrodes works to absorb the thermal stress transferred from the package to the circuit chip.

2. A capacitive semiconductor sensor according to claim 1, wherein said sensor chip has a predetermined thickness resistible against a thermal stress caused from the package.

3. A capacitive semiconductor sensor according to claim 1, wherein each of said plurality of first bump members has a first predetermined length between each of the plurality of first electrodes and each of the plurality of second electrodes, each of said plurality of second bump members has a second predetermined length between each of the plurality of third electrodes and each of the plurality of lead electrodes, and each of said first predetermined lengths of each of the plurality of first bump members is larger than each of said second predetermined lengths of each of the plurality of second bump members.

4. A capacitive semiconductor sensor according to claim 1, wherein each of said plurality of second bump members comprises:

a plurality of bumps mounted on each of the plurality of third electrodes; and a plurality of electrical conductive adhesive members interposed between each of the plurality of bumps and each of the plurality of lead electrodes.

5. A capacitive semiconductor sensor according to claim 1, wherein said circuit chip has a predetermined thickness that is absorptive to a thermal stress caused from the package.

6. A capacitive semiconductor sensor according to claim 1, wherein said circuit chip has a predetermined thickness absorptive to a thermal stress caused from the package.

7. A capacitive semiconductor sensor according to claim 1, wherein said circuit chip has a center portion inwardly concaved so that a thickness of the center portion is absorptive to a thermal stress caused from the package.

8. A semiconductor accelerator installed in an object, said semiconductor accelerator comprising:

a sensor chip including an acceleration detecting portion therein, a first surface, and a plurality of first electrodes, said plurality of first electrodes being disposed on the first surface and electrically connected to the acceleration detecting portion, said acceleration detecting portion being configured to detect a capacitance change corresponding to an acceleration change of the object to output an electric signal change representing the capacitance change through the plurality of first electrodes;

a circuit chip including a signal processing circuit therein, a second surface, and a plurality of second and third electrodes disposed on the second surface;

a package containing therein the sensor chip and the circuit chip and having a plurality of lead electrodes;

a plurality of first bump members mounted on the plurality of second electrodes, respectively, said sensor chip being mounted at its first surface on the second surface of the circuit chip so that the plurality of first electrodes are electrically mechanically connected to the plurality of second electrodes through the plurality of first bump members, respectively; and a plurality of second bump members mounted on the plurality of third electrodes, respectively, said plurality of third electrodes being electrically mechanically connected to the plurality of lead electrodes through the plurality of second bump members, respectively, wherein each of said plurality of first bump members has a first predetermined length between a corresponding one of the plurality of first electrodes and a corresponding one of the plurality of second electrodes, each of said plurality of second bump members has a second predetermined length between a corresponding one of the plurality of third electrodes and a corresponding one of the plurality of lead electrodes, said first predetermined length of each of the plurality of first bump members is different from said second predetermined length of a corresponding one of the plurality of second bump members, and wherein each of said plurality of second bump members comprises:

a bump mounted on each of the plurality of third electrodes; and an electrical conductive adhesive member with elasticity interposed between the bump and each of the plurality of lead electrodes, and wherein:

the object is a vehicle, the semiconductor accelerator is used in an environment depending on a heat cycle of the vehicle, the sensor chip has a first thermal expansion coefficient, the circuit chip has a second thermal expansion coefficient, the package has a third thermal expansion coefficient, the third thermal expansion coefficient being different from the first and second thermal expansion coefficients, the difference between the package and each of the sensor chip and the circuit chip in thermal expansion coefficient causing thermal stress from the package to be transferred to the sensor chip, and the elasticity of the electrical conductive adhesive interposed between the bump mounted on a corresponding one of the plurality of third electrodes and each of the plurality of lead electrodes works to absorb the thermal stress transferred from the package to the circuit chip.

* * * * *